United States Patent
Ossimitz (10) Patent No.: US 9,362,187 B2
(45) Date of Patent: Jun. 7, 2016

(54) CHIP PACKAGE HAVING TERMINAL PADS OF DIFFERENT FORM FACTORS

(71) Applicant: Infineon Technologies AG, Neubiberg (DE)

(72) Inventor: Peter Ossimitz, Munich (DE)

(73) Assignee: Infineon Technologies AG, Neubiberg (DE)

( * ) Notice: Subject to any disclaimer, the term of this patent is extended or adjusted under 35 U.S.C. 154(b) by 83 days.

(21) Appl. No.: 13/745,537

(22) Filed: Jan. 18, 2013

(65) Prior Publication Data
US 2014/0203278 A1    Jul. 24, 2014

(51) Int. Cl.
| H01L 23/58 | (2006.01) |
| H01L 23/48 | (2006.01) |
| G01R 31/26 | (2014.01) |
| H01L 21/66 | (2006.01) |
| H01L 23/498 | (2006.01) |

(52) U.S. Cl.
CPC .......... *H01L 22/32* (2013.01); *H01L 23/49838* (2013.01); *H01L 2224/48091* (2013.01); *H01L 2224/73204* (2013.01); *H01L 2224/73265* (2013.01)

(58) Field of Classification Search
CPC ... H01L 22/32; H01L 23/49838; H01L 24/49; H01L 24/17; H01L 24/14; H01L 24/06; H01L 2924/00; H01L 2924/15311; H01L 2224/48091

USPC ...................... 257/48, 698, 737, 693, E23.07; 438/14–18
See application file for complete search history.

(56) References Cited

U.S. PATENT DOCUMENTS

| 6,376,769 | B1 * | 4/2002 | Chung ........................... 174/524 |
| 7,524,697 | B2 | 4/2009 | Makihira et al. |
| 7,625,779 | B2 | 12/2009 | Takahashi |
| 2001/0015439 | A1 * | 8/2001 | Hembree et al. ................ 257/48 |
| 2004/0232446 | A1 * | 11/2004 | Nishimura et al. ........... 257/202 |
| 2006/0060959 | A1 * | 3/2006 | Hayashi et al. ............... 257/697 |
| 2007/0166879 | A1 * | 7/2007 | Fang .............................. 438/106 |
| 2008/0150101 | A1 * | 6/2008 | White et al. ................... 257/668 |
| 2008/0157076 | A1 * | 7/2008 | Jeong .............................. 257/48 |
| 2011/0140105 | A1 * | 6/2011 | Maruyama et al. ............. 257/48 |
| 2011/0233771 | A1 * | 9/2011 | Kwon et al. ................... 257/737 |
| 2013/0175686 | A1 * | 7/2013 | Meyer et al. ................... 257/738 |

FOREIGN PATENT DOCUMENTS

| CN | 1638108 A | 7/2005 |
| CN | 1954225 A | 4/2007 |

* cited by examiner

*Primary Examiner* — Fernando L Toledo
*Assistant Examiner* — Aaron Gray
(74) *Attorney, Agent, or Firm* — Slater Matsil, LLP

(57) ABSTRACT

A chip package includes an integrated circuit chip. A first group of terminal pads of the chip package is electrically connected to the integrated circuit chip and a second group of terminal pads of the chip package is electrically connected to the integrated circuit chip. The first and second groups of terminal pads are arranged on a common terminal surface of the chip package. A pad size of a terminal pad of the first group of terminal pads is greater than a pad size of a terminal pad of the second group of terminal pads.

29 Claims, 7 Drawing Sheets

CHIP PACKAGE HAVING TERMINAL PADS OF DIFFERENT FORM FACTORS

TECHNICAL FIELD

The invention relates to electronic devices, and more particularly to the technique of packaging integrated circuit semiconductor chips.

BACKGROUND

Semiconductor device manufacturers are constantly striving to increase the performance of their products, while decreasing their cost of manufacture. A cost intensive area in the manufacture of semiconductor devices is testing the semiconductor chips. As those skilled in the art are aware, package-level testing involves depositing individual chip packages into testing sockets to screen failed packages from good ones. Testing may be time consuming and may require a high number of testing sockets held available at the manufacturer.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION OF ILLUSTRATIVE EMBODIMENTS

Aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. The following description is therefore not to be taken in a limiting sense, and the scope is defined by the appended claims. It should also be noted that the representations of the various layers, sheets, chips or substrates in the Figures are not necessarily to scale.

In the following description, reference is made to the accompanying drawings, which form a part thereof, and in which is shown by way of illustration specific embodiments in which the invention may be practiced. In this regard, directional terminology, such as, e.g., "upper," "lower," "top," "bottom," "left-hand," "right-hand," "front side," "backside," etc., is used with reference to the orientation of the Figures being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention.

It is to be understood that the features of the various exemplary embodiments described herein may be combined with each other, unless specifically noted otherwise.

As employed in this specification, the terms "coupled" and/or "electrically coupled" are not meant to mean that the elements must be directly coupled together; intervening elements may be provided between the "coupled" or "electrically coupled" elements. However, one of the possible disclosures of the terms "coupled" and/or "electrically coupled" is that of a direct connection without intervening elements between the "coupled" or "electrically coupled" elements.

The semiconductor chips described herein may be of different types, may be manufactured by different technologies and may include for example integrated electrical, electro-optical or electro-mechanical circuits and/or passives. The semiconductor chips may include integrated circuits such as, e.g., logic integrated circuits, control circuits, microprocessors, memory devices, etc. The semiconductor chips need not be manufactured from specific semiconductor material such as, for example, Si, SiC, SiGe, GaAs, and, furthermore, may contain inorganic and/or organic materials that are not semiconductors, such as for example insulators, plastics or metals.

The semiconductor chip may have chip contact pads (or electrodes) which allow electrical contact to be made with the integrated circuits included in the semiconductor chip. The electrodes may include one or more electrode metal layers which are applied to the semiconductor material of the semiconductor chips. The electrode metal layers may be manufactured with any desired geometric shape and any desired material composition. The electrode metal layers may, for example, be in the form of a layer covering an area. Any desired metal, for example, Cu, Ni, NiSn, Au, Ag, Pt, Pd, and an alloy of one or more of these metals may be used as the material. The electrode metal layer(s) need not be homogenous or manufactured from just one material, that is to say various compositions and concentrations of the materials contained in the electrode metal layer(s) are possible.

Devices containing one or more packaged chips are described below. The chip package comprises the semiconductor chip(s) and a package substrate. The package substrate may comprise an electrical interconnect such as, e.g., a structured redistribution layer. The electrical interconnect is in electrical contact to chip electrodes. Further, the package substrate may comprise the terminal pads of the chip package. The terminal pads of the chip package are electrically connected to the integrated circuit via the electrical interconnect. Thus, the electrical interconnect may serve as an electrical rerouting structure coupling the terminal pads of the chip package to the chip electrodes.

The package substrate may comprise or be made of a polymer material or ceramics. For instance, the package substrate may comprise at least one insulating layer of a polymer material coated with a structured metal foil layer. The structured metal foil layer may be an electrical redistribution layer attached to the insulating layer. The insulating layer may be made on the basis of epoxy resin, polythetrafluoroethylene, aramid fibers or carbon fibers and may include reinforcement means such as fiber mats, for example glass or carbon fibers. By way of example, such package substrate may be a single-layer PCB (printed circuit boards) or a multi-layer PCB. Electrical redistribution structures as described above may be applied by thin-film processing on wafer level. In other embodiments, the package substrate may comprise a plate of ceramics coated with a structured metal layer. By way of example, such package substrates may be DCB (direct copper bonded) ceramics substrates.

The package substrate and the electrical interconnect may be used to produce fan-out type packages. In a fan-out type package at least some of the terminal pads and/or conductor lines of the electrical interconnect connecting the semiconductor chip to the terminal pads are located laterally outside of the outline of the semiconductor chip or do at least intersect the outline of the semiconductor chip. Thus, in fan-out type packages, a peripherally outer part of the package of the semiconductor chip is typically (additionally) used for electrically bonding the package to external applications, such as application boards etc. This outer part of the package encompassing the semiconductor chip effectively enlarges the contact area of the package in relation to the footprint of the semiconductor chip, thus leading to relaxed constraints in view of package terminal pad size and pitch with regard to later processing, e.g., board-level system integration (second level assembly).

Further, the packages may comprise an encapsulant. The encapsulant may, for example, comprise or be made of a thermoset material or a thermoplastic material. A thermoset material may, e.g., be made on the basis of an epoxy resin. A thermoplastic material may, e.g., comprise one or more materials of the group of polyetherimide (PEI), polyether-sulfone (PES) polyphenylene-sulfide (PPS) or polyamide-imide (PAI). Thermoplastic materials melt by application of pressure and heat during molding or lamination and (reversibly) harden upon cooling and pressure release. The encapsulant may be a mold material or a laminate material. The encapsulant may, e.g., be applied during a process of wafer-level packaging (WLP) or during other packaging processes.

Figure 1A:
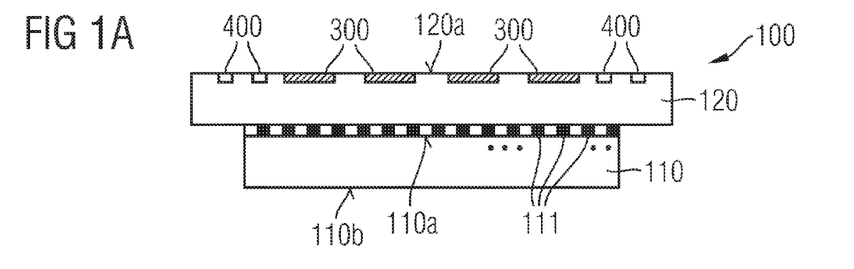
FIG. 1A is a sectional view schematically illustrating a chip package 100 in accordance with one embodiment.

FIG. 1A illustrates a chip package 100 in accordance with one embodiment described herein. The package 100 comprises a semiconductor chip 110 electrically and mechanically coupled to a package substrate 120. The semiconductor chip 110 may have been processed by front-end wafer level technology to contain an integrated circuit. By way of example, the upper surface 110a of the semiconductor chip 110 has been processed so that an active region of the semiconductor chip 110 comprising, e.g., integrated transistors etc. is implemented adjacent to upper surface 110a thereof.

Further, a plurality of chip electrodes 111 may be arranged on the upper surface 110a of the semiconductor chip 110. The chip electrodes 111 are electrically coupled to the integrated circuit of the semiconductor chip 110 via a chip-internal wiring.

The package substrate 120 may have a main upper surface 120a and a main lower surface 120b opposite to the upper surface 120a. The lower surface 120b of the package substrate 120 faces the upper surface 110a of the semiconductor chip 110 and is connected thereto.

The upper surface 120a of the package substrate 120 may be provided with a first group of terminal pads 300 and a second group of terminal pads 400. The first and second groups of terminal pads 300, 400 represent the external terminals of the semiconductor chip package 100. The upper surface 120a of the package substrate 120 thus represents a common terminal surface of the chip package 100 on which the terminal pads 300, 400 are arranged. The package substrate 120 may, e.g., be an organic substrate, a ceramic substrate, etc. Further, the package substrate 120 may, e.g., be a laminate substrate strip comprising a flexible resin tape, a rigid fiber-glass/copper sheet laminate, a co-fired ceramic substrate, etc.

The package substrate 120 comprises an electrical interconnect (not shown) configured to electrically couple individual chip electrodes 111 to individual terminal pads 300, 400 of the package 100. As a person skilled in the art will be aware, a plurality of technologies are available to establish such electrical interconnect, e.g., thin film technology for creating an electrical redistribution structure, vias technology for creating electrical throughputs passing through the package substrate 120, etc. The electrical interconnect (not shown) may be arranged on the upper surface 120a of the package substrate 120, the lower surface 120b of the package substrate 120 or may be provided as an internal electrical interconnect of the package substrate 120 sandwiched between insulating layers thereof. In all these cases, the electrical interconnect may be formed by a structured metal foil and/or the package substrate 120 together with the electrical interconnect may represent an electrical redistribution structure.

The mounting surface of the semiconductor package 100 may be realized by the lower (backside) surface 110b of the bare semiconductor chip 110. Thus, this lower surface 110b of the semiconductor chip may be partly or completely exposed. Semiconductor package 100 may thus be a "bare die package" as will be explained in more detail further below. A mounting surface is the surface of the package which, when mounted to an application board, is bonded directly to the application board.

Figure 1B:
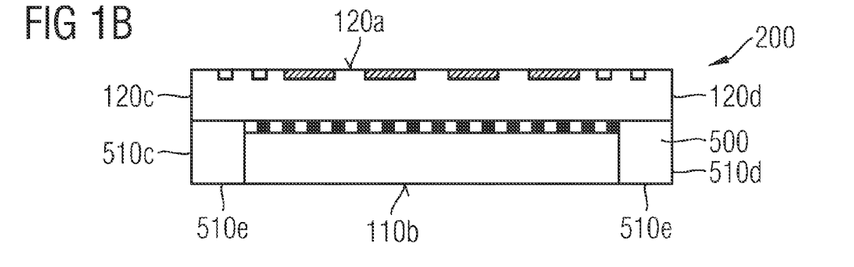
FIG. 1B is a sectional view schematically illustrating a chip package 200 in accordance with one embodiment.

FIG. 1B illustrates a chip package 200. In view of the semiconductor chip 110, the chip electrodes 111, the package substrate 120, the electrical interconnect (not shown) and the first and second groups of terminal pads 300, 400, the chip package 200 may have the same structure and characteristics as chip package 100, and reference is made to the above disclosure to avoid reiteration. Further, chip package 200 may comprise an encapsulant 500.

The encapsulant 500 may be made of a mold material or a laminate material, e.g., a thermoplastic or thermoset material as mentioned above. The encapsulant 500 may cover a part of or all side faces of the bare semiconductor chip 110. Some or all side faces of the bare semiconductor chip 110 may be completely covered by the encapsulant 500. Only the side faces of the bare semiconductor chip 110 may be covered by the encapsulant 500. Outer side faces 510c and 510d of the encapsulant 500 may be flush with outer side faces 120c, 120d of the package substrate 120, respectively, thus forming corresponding package side faces 120c, 510c and 120d, 510d. Further, the lower (backside) surface 110b of the semiconductor chip 110 may level with the lower package bottom faces 510e of the encapsulant 500. It is to be noted that the encapsulant 500 may not cover the lower (backside) surface 110b of the semiconductor chip 110.

The lower (backside) surface 110b of the semiconductor chip 110 may be partly or completely uncovered, e.g., a bare chip surface may be exposed. In this case, similar to chip package 100, the chip package 200 is a bare die package. Bare die packages such as, e.g., chip package 100 or 200 may be mounted to application boards the same way as bare dies. Thus, known bare die mounting technology and bonding materials (e.g., adhesives) may be used by the customer to attach the bare die package 100, 200 to an application board. Further, as the backside surface 110b of a bare die package such as, e.g., chip package 100 or chip package 200 is identical to the backside surface of a bare die (e.g., semiconductor chip 110), the same advantages (e.g., high thermal connectivity between bare die package 100, 200 and application board, high design flexibility) may be obtained as in bare die mounting technology such as, e.g., chip-on-board (COB) technology.

It is to be noted that the backside surface 110b may, e.g., be formed by a thin protection layer (not shown) coating the semiconductor material of the semiconductor chip 110, e.g., a hard passivation layer, an oxide layer, a nitride layer or a (thin) polymer layer. The protection layer should be thin and have a high thermal conductivity. That is, the expressions "bare die" and "exposed surface" as used herein may be understood to exclude the encapsulant 500 to cover the backside surface 110b, but may comprise implementations in which a (thin) protection layer is provided to form the backside surface 110b.

The chip package 200 depicted in FIG. 1B or other examples of chip packages considered herein may be manufactured on wafer-level, e.g., by a wafer-level process in which the processed semiconductor chips are cut from a wafer, placed in a space-apart relationship on a temporary carrier, and embedded in an mold material forming the encapsulant 500. The package substrate 120 may then be applied to the so-called "artificial wafer" or "molded reconfigured wafer" formed by the encapsulant 500 and the semiconductor chips 120 distributed therein. Only after applying the encapsulant 500 and the package substrate 120, single packages 200 are cut from the "artificial wafer." Packaging on wafer-level is known in the art to produce so-called wafer-level packages (WLP). Chip packages considered herein, e.g., chip package 200, may, e.g., be a WLP.

Chip packages considered herein may be fan-out type packages as illustrated by way of example in FIGS. 1A and 1B. Fan-out type packages allow the common terminal surface of the package (here, e.g., the upper surface 120a) to extend beyond the outline of the semiconductor chip 110. The first and second terminal pads 300, 400 therefore do not need to be arranged within the outline of the semiconductor chip 110, but may be distributed over a larger area. Without saying, in many semiconductor chips 110, e.g., logic circuits, microcontrollers, etc., a high number of chip electrodes are necessary, and thus, a high terminal count (often referred to as "pin count") of the packet is required. Fan-out type packages such as chip packages 100, 200 provide increased area available for the arrangement of the (external) package terminal pads 300, 400. To this end, at least one lateral dimension of the package substrate 120 is greater than the corresponding lateral dimension of the semiconductor chip 110.

In other examples the chip packages considered herein may be fan-in type packages. In fan-in type packages all terminal pads 300, 400 are arranged within the outline of the semiconductor chip 110. Further, each lateral dimension of the package substrate 120 may, e.g., be equal or smaller than the corresponding lateral dimension of the semiconductor chip 110. By way of example, chip package 100 may be realized as a fan-in type package if the package substrate 120 is laterally confined to not extend beyond the outline of the semiconductor chip 110.

Packages considered herein may, e.g., be so-called bare die packages. By way of example, package 100 as well as package 200 as illustrated in FIGS. 1A and 1B are referred to as bare die packages in accordance with the above explanations.

Packages considered herein may, e.g., be single-chip packages. By way of example, the chip packages 100, 200 illustrated in FIGS. 1A and 1B are examples of single-chip packages. Alternatively, packages considered herein may, e.g., be multi-chip packages.

Packages considered herein may, e.g., be chip-scale packages (CSP) and/or wafer-scale packages (WSP). A CSP is defined herein as a package whose lateral dimensions are less than 1.5 times that of the bare semiconductor chip 110. Thus, both packages 100, 200 described above may, e.g., be CSPs. Further, package 200 may be a WSP if manufactured by wafer-level packaging (WLP) technology.

Packages considered herein may, e.g., be wire-bond packages. Wire-bond packages as referred to herein are packages having a common terminal surface which contains all (external) terminals pads of the package, and wherein the terminal pads are configured such that electrical contact to an application board is exclusively done by wire-bonding.

Packages considered herein are tested by the component manufacturer before being shipped to the customer. In the following, package-level testing processes are considered. One type of a package-level testing process is referred to as a burn-in test in the art. In a burn-in test one or more chip packages are individually disposed in corresponding test sockets of a burn-in board and the contact pins in the burn-in sockets will make electrically connections with the (external) terminal pads of the chip packages. The devices (i.e., packages) under test are then exposed to an elevated temperature environment and components of the package are exercised by applying input biases to simulate semiconductor chip operation for a long period of time, e.g., several hours. Burn-in test temperature may exceed 100° C. and burn-in time may be longer than e.g., 8 or 12 hours. Thus, by applying a burn-in, early in-use system failures can be avoided at the expense of a reduced yield caused by the burn-in process. It is to be noted that a package-level burn-in test screens the entire system (i.e., the package) and thus reveals failures caused by the integrated circuit or chip as well as failures caused by a loss of electrical contact at the chip-substrate interface or within the electrical interconnect of the substrate 120 or at the terminal pads. Such failures may, e.g., be caused by different CTE (coefficient of thermal expansion) of the semiconductor chip 110 and the package substrate 120 or may also be caused by defective burn-in test sockets.

Another type of a package-level testing process is referred to herein as a functional test. In a functional test a chip package is disposed in a test socket for performing the functional test. In a functional test structure and functionality of the chip is tested. The test duration per chip package is only a few second, i.e., many orders of magnitude shorter than test duration of a burn-in test. Typically, different test sockets are used for the burn-in test and the functional test.

Due to the long burn-in test duration, a vast number of burn-in test sockets are needed at the manufacturer. Therefore, the cost of a burn-in test socket is a highly cost sensitive parameter in the overall manufacturing process. By way of example, the cost of a burn-in test socket may be about $5 to $50 U.S. whereas the cost of a socket for a functional test may be about $1,000 to $5,000 U.S. Nevertheless, due to the high number of burn-in test sockets needed, the overall costs are much more effected by the cost of a burn-in test socket than by the cost of a test socket for functional tests.

Figure 2:
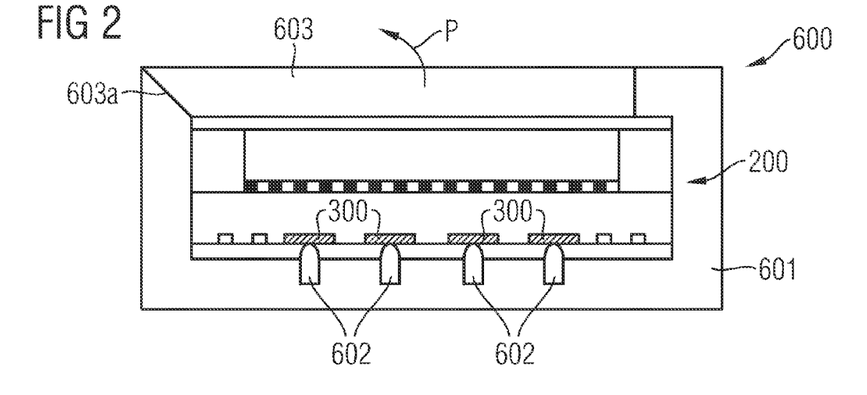
FIG. 2 is a sectional view of an exemplary chip package inserted in a burn-in test socket for performing a burn-in test.

FIG. 2 illustrates an exemplary burn-in test socket 600 in which a chip package such as, for example, chip package 200 is inserted. The burn-in test socket 600 may comprise a socket body 601 and a plurality of contacts 602 received in the socket body 601. Further, the burn-in test socket 600 may comprise a lid 603 movably mounted at the socket body 601. By way of example, the lid 603 may, e.g., be pivotally supported on the socket body 601 at reference numeral 603a and may be open by a movement along arrow P. In FIG. 2 the lid 603 is closed. The chip package 200 is inserted in a recess of the socket body 601. A part or all of the terminal pads 300 of the first group of terminal pads are in contact with corresponding contacts 602 of the burn-in test socket. Thus, the contacts 602 of the burn-in test socket are aligned to the terminal pads 300 of the first group of terminal pads. As to the second group of terminal pads 400, the burn-in test socket does not contain contacts to make electrical connections to these terminals.

Figure 3:
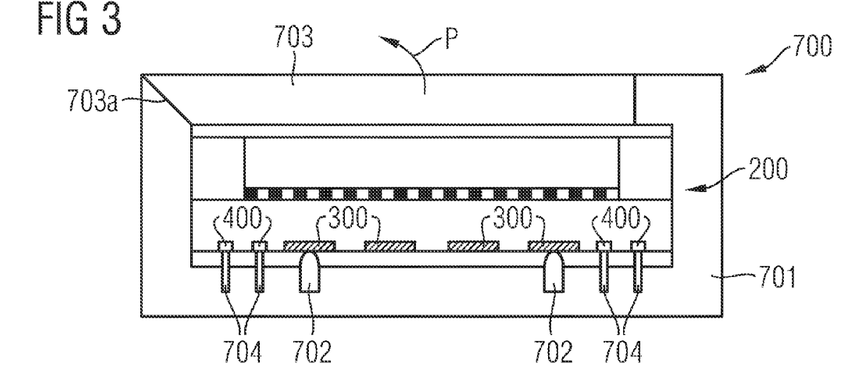
FIG. 3 is a sectional view of an exemplary chip package inserted in a test socket for performing a functional test.

FIG. 3 illustrates a test socket 700 for a functional test. Test socket 700 for a functional test may comprise a socket body 701, a removable lid 703, e.g., pivotally hinged at the socket body 701 at reference numeral 703a and contacts 704. In view of the socket body 701 and the lid 703, the test socket 700 for a functional test is similar to the burn-in test socket 600 and reference is made to the corresponding disclosure to avoid reiteration. Contacts 704, however, are operatively connected to the terminal pads 400 of the second group of terminal pads of the chip package 200. With regard to the terminal pads 300 of the first group of terminal pads, it may be the case that the test socket 700 for a functional test does not have any contacts to make electrical contact to these terminals. In another example as illustrated in FIG. 3, contacts 702 may be received in the socket body 701 to make electrical contact to at least a part of the terminal pads 300 of the first group of terminal pads. It is to be noted that terminal pads 300 may also be used as debug pads used for diagnostic before or after the package integration. In particular, the terminal pads 300 may be used after the system integration, e.g., by wire-bonding to debug the system with a dedicated adapter.

Thus, during burn-in testing exclusively terminal pads 300 of the first group of terminal pads are contacted. On the other hand, during functional testing terminal pads 400 of the second group of terminals are contacted and, optionally, a part or possible all of the terminal pads 300 of the first group of terminals are contacted.

Terminal pads 300 of the first group of terminal pads do have a form factor which is different from the form factor of terminal pads 400 of the second group of terminal pads. As used herein, the meaning of the expression "form factor" of terminal pads comprises the pad size and/or the pitch of terminal pads. That is, the pad size of a terminal pad 300 of the first group of terminal pads may be greater than the pad size of a terminal pad 400 of the second group of terminal pads. Further, a pitch between terminal pads 300 of the first group of terminal pads may be greater than a pitch between terminal pads 400 of the second group of terminal pads.

The difference in the form factors associated with the first and second groups of terminal pads 300, 400 allows to significantly reduce the cost of a burn-in test socket, e.g., burn-in test socket 600. In contrast to the conventional approach, where all terminal pads used for burn-in testing and for functional testing have same parameters in view of pad size, pitch, etc., the disclosure herein allows to exclusively use terminal pads of a relaxed form factor (e.g., pad size, pitch) during burn-in testing and to use terminal pads of a "tighter" form factor during functional testing.

This concept allows to reduce the costs of a burn-in test socket because the larger the pad-size and/or the greater the pitch, the cheaper is the burn-in socket. Further, the reliability of the electrical contact between the contacts 602 and the terminal pads 300 of the chip package 200 during burn-in test is improved. This reduces the probability of burn-in test failures caused by electrical contact problems between the socket 600 and the package 200 during the long duration of a burn-in test in an oven. Further, since the electrical contact tolerances between the burn-in test socket 600 and the chip package 200 are increased, the burn-in test sockets 600 may have a longer lifetime compared to conventional burn-in test sockets having the standard (i.e., smaller) pitch and/or a pad size dimension.

As concerns the test socket 700 for performing the functional test, contact parameters such as terminal pad size and/or pitch of the terminal pads 400 of the second group of terminal pads may be significantly smaller than the corresponding parameters of the terminal pads 300 of the first group of terminal pads. However, as mentioned before, the number of burn-in test sockets 600 needed at the manufacturer is much higher than the number of test sockets 700 for performing the short duration functional testing. Therefore, using fine contact parameters for pad size or pitch (i.e., tight form factors) is more acceptable for functional testing than for burn-in testing in view of costs.

Generally speaking, the package-level test flow comprising at least the burn-in test and the functional test is mapped to the terminal pad design of the common terminal surface of the package. Whilst terminal pads 300 having a relaxed form factor are available during burn-in testing, terminal pads 400 having a comparatively shrinked form factor are used during functional testing.

Figure 4:
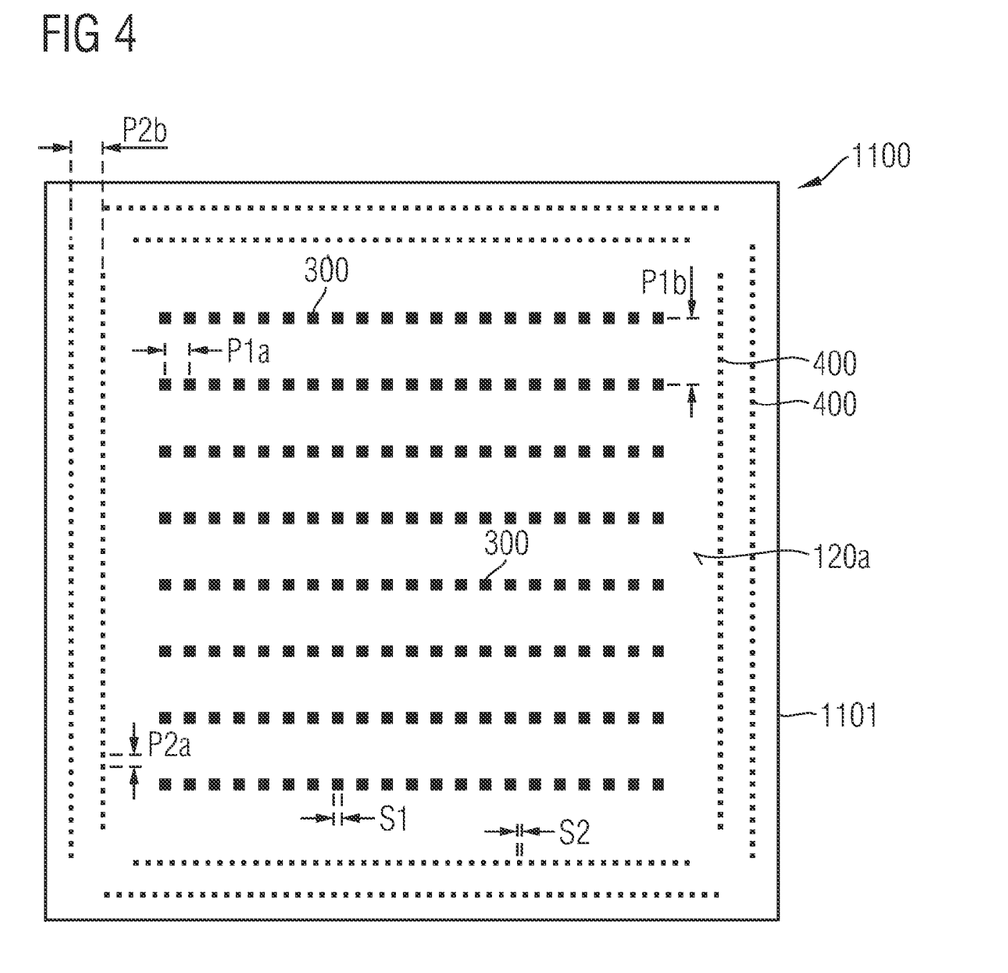
FIG. 4 illustrates an example of a layout of a terminal surface of an exemplary chip package.

FIG. 4 illustrates an example of a terminal surface layout 1100 of an exemplary chip package such as, e.g., chip package 100 or 200. FIG. 4 is a top view on the upper surface 120a of the package substrate 120. An outline 1101 of the terminal surface layout 1100 may be defined by the outline of the package substrate 120. In this example, the terminal pads 300 of the first group of terminal pads are arranged in a first array and the terminal pads 400 of the second group of terminal pads are arranged in a second array. Here, the first array defines a first terminal region on the common terminal surface 120a and the second terminal array defines a second terminal region on the common terminal surface 120a of the package. In FIG. 4, by way of example, the first terminal region is an inner region of the common terminal surface 120a which is completely surrounded by the second terminal region. The first terminal region may be a contiguous region, e.g., a contiguous region having a rectangular or quadratic shape. The second terminal region may also be a contiguous region as, e.g., shown in FIG. 4. By way of example, the second terminal region is arranged in a peripheral region of the terminal surface layout 1100 adjacent to the outline 1101 thereof. The second terminal region may be arranged adjacent to the entire outline 1101 of the terminal surface layout 1100. The second terminal region may completely surround the first terminal region. The first terminal region and the second terminal region are, e.g., separated from each other, i.e., they do not overlap. Other possible designs and variations thereof will be described further below.

The first array of first terminal pads 300 may be organized in rows and/or columns. Column spacing and row spacing may define pitches P1a and P1b, respectively. Referring to the second terminal pads 400 arranged in the second array of second terminal pads 400, pitches P2a and P2b between terminal pads 400 of the second group of terminal pads may be defined in a similar fashion.

Further, a pad size S1 of a terminal pad 300 of the first group of the terminal pads and a pad size S2 of a terminal pad 400 of the second group of terminal pads may be defined. The corresponding pad sizes S1 and S2 are the lateral dimension of the corresponding terminal pads 300, 400. In FIG. 4, by way of example, the terminal pads 300, 400 have the shape of a square. If the terminal pads 300, 400 are shaped differently, S1 and S2 may relate to a diameter, a minimum lateral dimension, etc.

Pad pitches and pad sizes may e.g. be as follows. Terminal pads 300 of the first group of terminal pads (burn-in test pads) may have the following dimensions:

400 µm≤P1a≤1000 µm and/or 400 µm≤P1b≤1000 µm,
200 µm≤S1≤600 µm.

The pitch P1a, P1b of each terminal pad 300 may be same or greater than 400 µm or 500 µm, more particularly same or greater than 600 µm, still more particularly same or greater than 700 µm or even 800 µm. The pad size S1 of each terminal pad 300 may be same or greater than 200 µm or 250 µm, more particularly same or greater than 300 µm, and still more particularly same or greater than 400 µm or even 500 µm. By way of example, a pitch P1a and/or P1b may be about 800 µm and, by way of example, a pad size S1 may be about 500 µm.

Terminal pads 400 of the second group of terminal pads (test pads for the functional test) may have the following dimensions:

200 µm≤P2a≤400 µm and/or 200 µm≤P2b≤400 µm,
150 µm≤S2≤250 µm.

The pitch P2a, P2b of each terminal pad 400 may be same or smaller than 400 µm, more particularly same or smaller than 300 µm or 250 µm. The pad size S2 of each terminal pad 400 may be same or smaller than 250 µm, more particularly same or smaller than 200 µm. By way of example, the pitch P2a and/or P2b may be about 300 µm and, by way of example, a pad size S2 may be about 170 µm.

Here and in the other embodiments a number of, e.g., 20-60 terminal pads 300 of the first group of terminal pads (e.g., burn-in test pads) may be provided. These terminal pads 300 may comprise I/O (input/output) terminal pads and power supply pads. As an specific example, a total number of, e.g., about 30 terminal pads 300 of the first group of terminal pads may be provided.

Here and in the other embodiments a number of 100-180 terminal pads 400 of the second group of terminal pads may be provided. By way of example, all terminal pads 400 may be I/O terminal pads. In this case, power supply during the functional test is supplied via some of the terminal pads 300 of the first group of terminal pads (see, e.g., FIG. 3). By way of example, in addition to the terminal pads 400 of the second group of terminal pads, a number of, e.g., 10-25 terminal pads 300 of the first group of terminal pads may be contacted during functional testing. It is also possible that all terminal pads 300 of the first group of terminal pads that are contacted during functional testing are power supply pads. As a specific example, a number of, e.g., about 140 I/O terminal pads 400 of the second group of terminal pads and a number of, e.g., about 20 power supply terminal pads 300 of the first group of terminal pads may be contacted during functional testing.

More specifically, in the above example the common terminal surface 120 may comprise, e.g., 30 terminal pads 300 of the first group of terminal pads (I/O pads and power supply pads) and, e.g., 140 terminal pads 400 of the second group of terminal pads (I/O pads only). The package-level burn-in test (see FIG. 6) may use all, e.g., 30 terminal pads 300 and the functional test may use a part, e.g., 20, of terminal pads 300 (power supply pads only) and, e.g., all 140 terminal pads 400 (I/O pads only).

As mentioned before terminal pads 400 of the second group of terminal pads may be arranged close to one or a plurality of edges (corresponding to outline 1101) of the common terminal surface 120a. By way of example, terminal pads 400 may be arranged in two to four parallel rows running along one or more of the plurality of edges. In FIG. 4, by way of example, the terminal pads 400 are illustrated to run in, e.g., two parallel rows close to all four edges of the common terminal surface 120a.

A vast variety of different designs or shapes of the first region (defined by the outline of the first array of terminal pads 300) and the second region (defined by the outline of the second array of terminal pads 400) are feasible. Without loss of generality, FIGS. 5-8 illustrate a non-limiting selection of various terminal surface layout designs.

Figure 5:
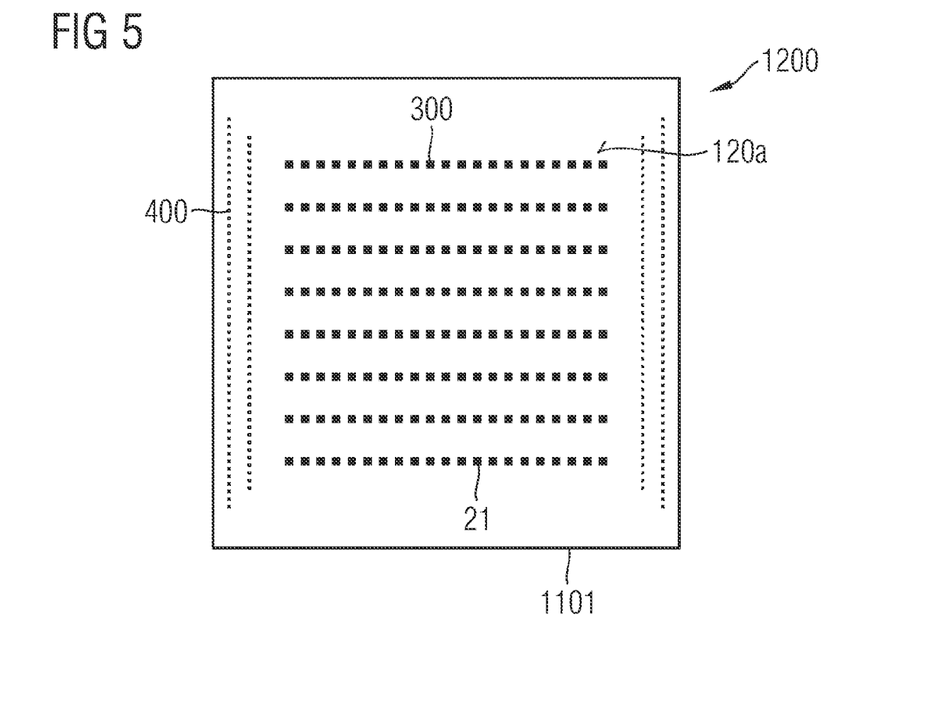
FIG. 5 illustrates an example of a layout of a terminal surface of an exemplary chip package.

FIG. 5 illustrates an exemplary terminal surface layout 1200. Terminal surface layout 1200 distinguishes from terminal surface layout 1100 in that only, e.g., two edges of the common terminal surface 120a are equipped with terminal pads 400 of the second group of terminals. Except that, all above disclosure is applicable to terminal surface layout 1200 of FIG. 5.

Figure 6:
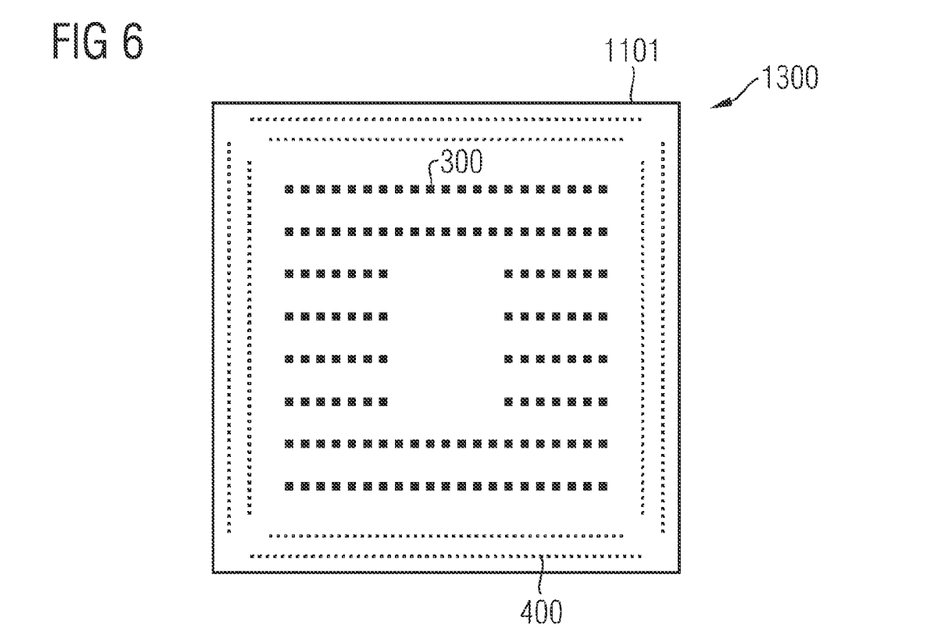
FIG. 6 illustrates an example of a layout of a terminal surface of an exemplary chip package.

FIG. 6 illustrates an exemplary terminal surface layout 1300. Terminal surface layout 1300 distinguishes from terminal surface layout 1100 in that a central zone of the first region, defined by the outline of the first array of terminal pads 300, is free of terminal pads 300.

Except that, all above disclosure is applicable to terminal surface layout 1300 of FIG. 6.

Figure 7:
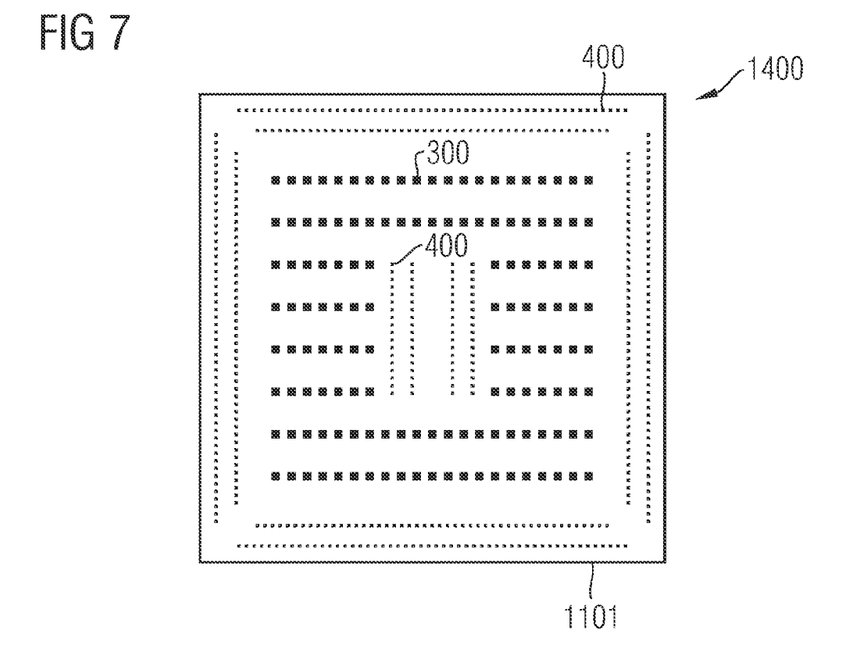
FIG. 7 illustrates an example of a layout of a terminal surface of an exemplary chip package.

FIG. 7 illustrates an exemplary terminal surface layout 1400. Terminal surface layout 1400 distinguishes from terminal surface layout 1300 in that the central zone free of terminal pads 300 is filled with terminal pads 400. Except that, all above disclosure is applicable to terminal surface layout 1400 of FIG. 7.

Figure 8:
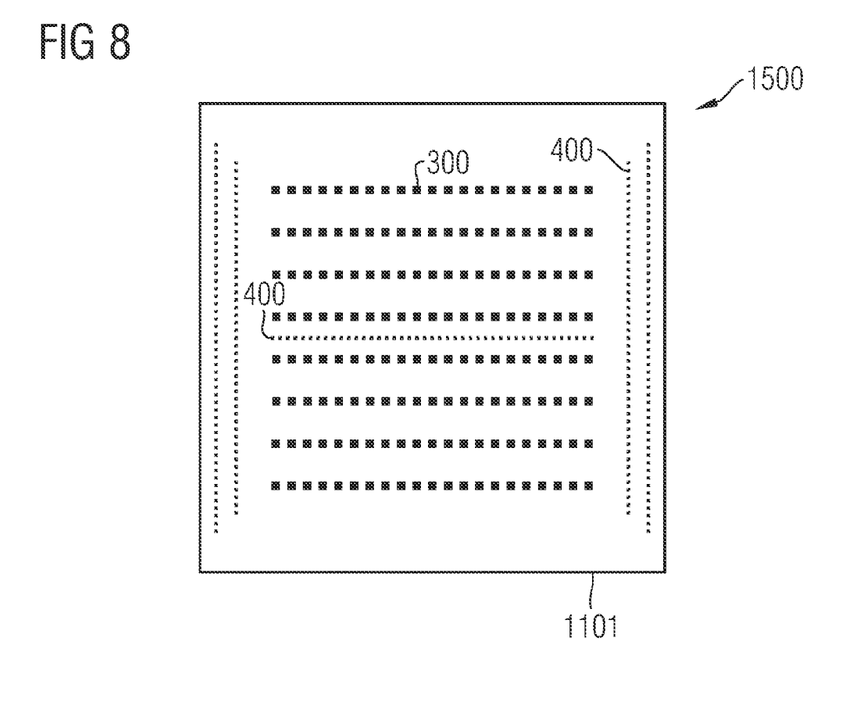
FIG. 8 illustrates an example of a layout of a terminal surface of an exemplary chip package.

FIG. 8 illustrates an exemplary terminal surface layout 1500. Terminal surface layout 1500 distinguishes from terminal surface layout 1200 in that a row of terminal pads 400 passes through the first region defined by the outline of the first array of terminal pads 300. Except that, all above disclosure is applicable to terminal surface layout 1500 of FIG. 8. In all embodiments, a standardized terminal pad layout may be used and product scalability can be obtained.

Figure 9:
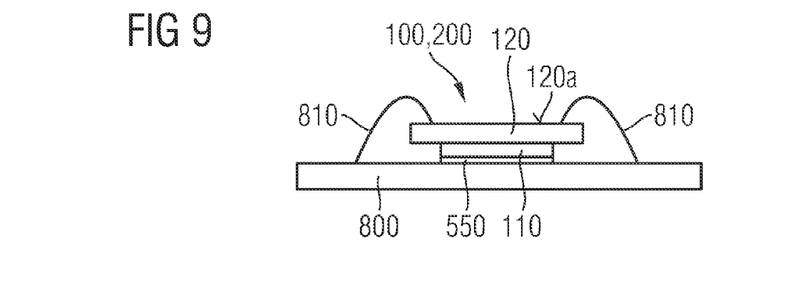
FIG. 9 illustrates an example of a chip package mounted on an application board by, e.g., wire-bonding.

By way of example, as illustrated in FIG. 9, a chip package such as, e.g., chip package 100, 200 may be bonded to an application board 800. The chip packages 100, 200 may be mounted on the customer's application board 800, e.g., a PCB, the same way as a bare die. For that reason, the chip package 100, 200 is referred to as a bare die package. That is, an adhesive 550 may be used to glue the chip package 100, 200 to a mounting surface of the application board. The adhesive 550 may be designed as a thin layer located between and, e.g., in direct contact to the lower surface 110b of the semiconductor chip 110 and the mounting surface of the application board. The adhesive 550 may have a high thermal conductivity to provide the same advantages as known in the technology of bare die mounting.

By way of example, the technique of wire-bonding may be used to electrically connect the chip package 100, 200 to the application board 800. In this case, wire-bonds 810 are drawn from terminal pads on the common terminal surface 120a of the chip package 100, 200 to electrical circuits or interconnect structure of the application board 800. The mounting surface of the application board and the interconnect structure of the application board to which electrical contact via, e.g., wire-bonding is made may, e.g., be made of the same structured metal layer (not shown) at the top of the application board 800. Electrical contact of the chip package 100, 200 to the application board 800 by bond-wires and thermal contact of the chip package 100, 200 to the application board 800 at the exposed backside 110b of the semiconductor chip 110 may thus be made by the same structure and/or at the same level of the application board 800. By way of example, the application board 800 may be a PCB or a ceramics substrate coated with a metal layer, e.g., a DCB. FIG. 9 illustrates, by way of example, a wire-bond system integration of a bare die package 100, 200, which is typically performed by the customer after shipping the semiconductor package 100, 200 to the customer.

By way of example, terminal pads 300 of the first group of terminal pads may not be intended for board-level system integration, i.e., no terminal pad 300 is, e.g., wire-bonded as illustrated in the example of FIG. 9. Thus, these pads 300 may be configured exclusively as test pads, in particular as mere burn-in pads or as burn-in pads and test pads for the functional test.

Terminal pads 400 of the second group of terminal pads may be used as wire-bond pads, either a part thereof or all. By way of example, in terminal surface layouts 1100, 1200, 1300, all terminal pads 400 may be used as wire-bond pads, whereas in terminal surface layouts 1300 and 1500 only the terminal pads 1400 arranged close to an edge of the common terminal surface 120a may be used as wire-bond pads.

Figure 10A:
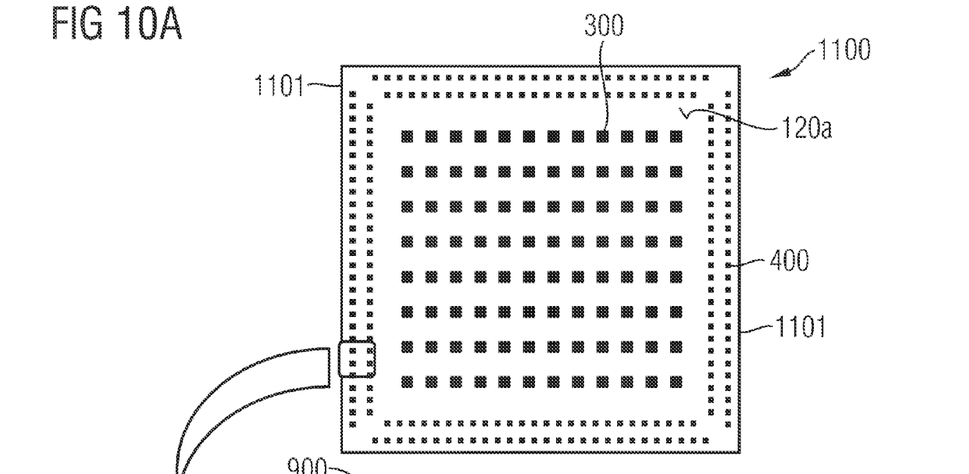
FIGS. 10A and 10B illustrate the example of a layout of a terminal surface of an exemplary chip package of FIG. 4 and a detail of this exemplary layout.
Figure 10B:
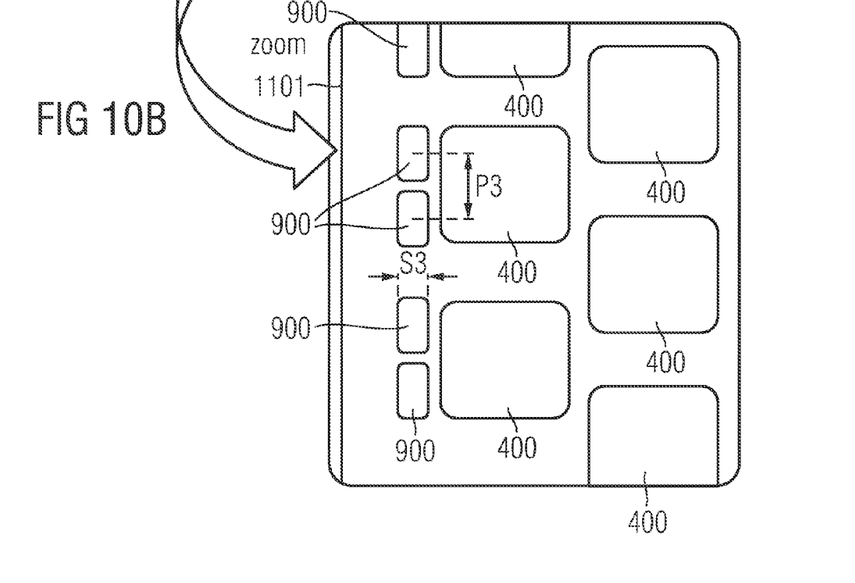

Further, in addition to the terminal pads 300 of the first group of terminal pads and, optionally, the terminal pads 400 of the second group of terminal pads, terminal pads 900 of a third group of terminal pads of the chip package may be provided on the common terminal surface 120a of the chip package disclosed herein. The lower portion of FIG. 10 illustrates a detail of the upper portion of FIG. 10, the latter being identical to FIG. 4. The detail shown in the lower portion of FIG. 10 illustrates an enlarged edge portion of terminal surface layout 1100. It is to be noted that the detail shown in the lower portion of FIG. 10 is applicable to all packages and terminal surface layouts 1100 to 1500 thereof and, more generally, to all common terminal surfaces considered herein. Terminal pads 900 of the third group of terminal pads may have a pitch P3 and a pad size S3.

Pad pitches and pad sizes may e.g. be as follows. Terminal pads 900 of the third group of terminal pads may have the following dimensions:

5 µm≤P3≤150 µm,
40 µm≤S3≤100 µm.

The pitch P3 of each terminal pad 900 may be same or smaller than 150 µm, more particularly same or smaller than 120 µm or 100 µm. Pad size S3 of each terminal pad 900 may be same or smaller than 150 µm, more particularly same or smaller than 100 µm. Pad size S3 of a terminal pad 900 may be smaller than a pad size S2 of a terminal pad 400. By way of example, pitch P3 may, e.g., be about 100 µm. By way of example, pad size S3 may, e.g., be 60×100 µm.

The terminal pads 900 of the third group of terminal pads may be arranged in a third array the outline thereof defining a third terminal region on the common terminal surface 120a of the package, the first terminal region and third terminal region may be separated from each other, i.e., are non-overlapping. Further, the third terminal region may partly or completely surround the first terminal region. As illustrated in the lower portion of FIG. 10, terminal pads 900 of the third group of terminal pads may, e.g., be located in one or more most outer rows. That is, terminal pads 900 of the third group of terminal pads may be located in a region between the outline 1101 of the common terminal surface 120a and the outermost row of terminal pads 400 of the second group of terminal pads.

All terminal pads 900 of the third group of terminal pads may be terminal pads used for board-level system integration, e.g., wire-bond pads (see FIG. 9). In particular, terminal pads 900 of the third group of terminal pads may partly or exclusively be power supply pads. Such power supply pads are wire-bonded down to supply rails on the customer's application board 800.

By way of example, a number of 50 to 100 terminal pads 900 of the third group of terminal pads may be provided. For example, these terminal pads 900 may all be power supply pads. In the specific example described above, e.g., 140 terminal pads 400, which may, e.g., be exclusively I/O pads, and, e.g., 70 terminal pads 900, which may, e.g., be exclusively power supply pads, may be provided on the common terminal surface 120 and electrically connected to the application board 800 by, e.g., bonding wires.

Terminal pads of the chip package which are used for board-level system integration (i.e., for electrical connection to the application board) as described above must not be wire-bonding pads. Board-level system integration may also be performed by other techniques such as, e.g., soldering, ultrasonic bonding, conductive gluing, sintering, etc. In this case, the terminal pads of the chip package used for board-level system integration are configured for one of these bonding techniques.

Figure 11A:
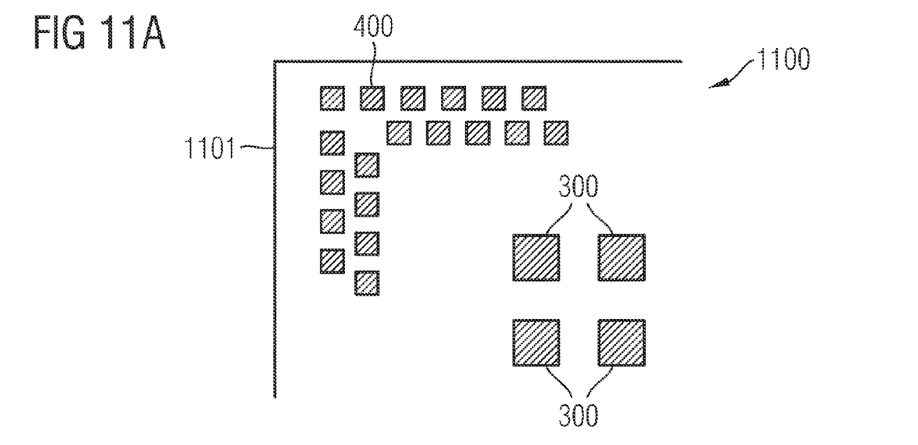
FIGS. 11A-11C illustrate further details of the layout of a terminal surface of an exemplary chip package.

FIG. 11A illustrates an enlarged corner portion of terminal surface layout 1100. The second terminal pads 400 may be grouped together and are, e.g., spaced apart from the first terminal pads 300 by a minimum distance larger as, e.g., a maximum pad size dimension of the first terminal pads 300.

Figure 11B:
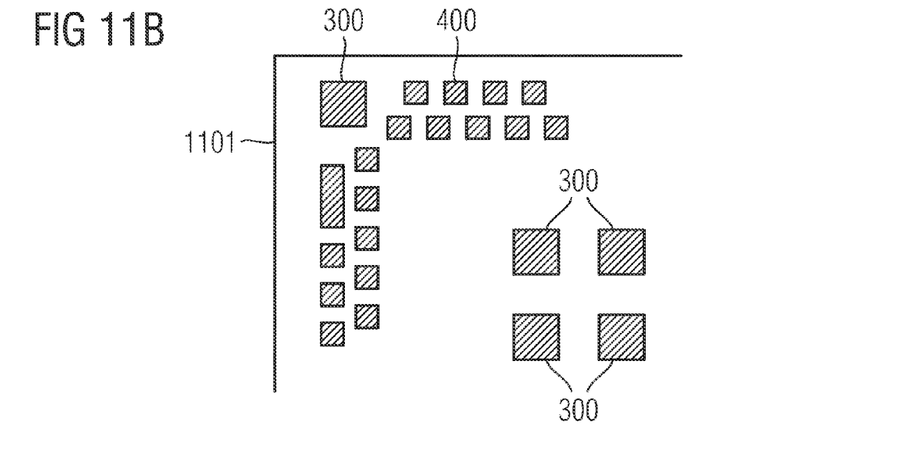

FIG. 11B illustrates a variation of the layout shown in FIG. 11A. By way of example, one or more first terminal pad 300 may be arranged in the vicinity of the outline 1101 of the footprint 1100, e.g., at an corner of the outline 1101. The one or more first terminal pad 300 may be distributed within the second terminal region.

Figure 11C:
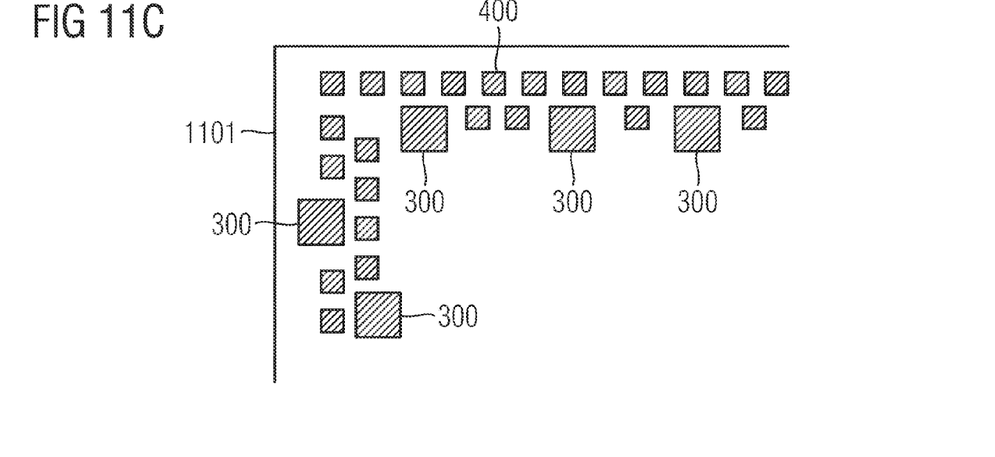

FIG. 11C illustrates a further variation of the layout shown in FIG. 11A. By way of example, first terminal pads 300 may be distributed in a row and/or a column formed by second terminal pads.

It is to be noted that a part of or all terminal pads of the chip package may be configured to be bonded to an application board by means other than wire bonds. By way of example, solder deposits, electrically conducting adhesives or metal pillars may be used to electrically interconnect and mechanically mount the chip package on a board. In these and other cases, the technique of flip-chip mounting the package to the application board may be employed.

Figure 12:
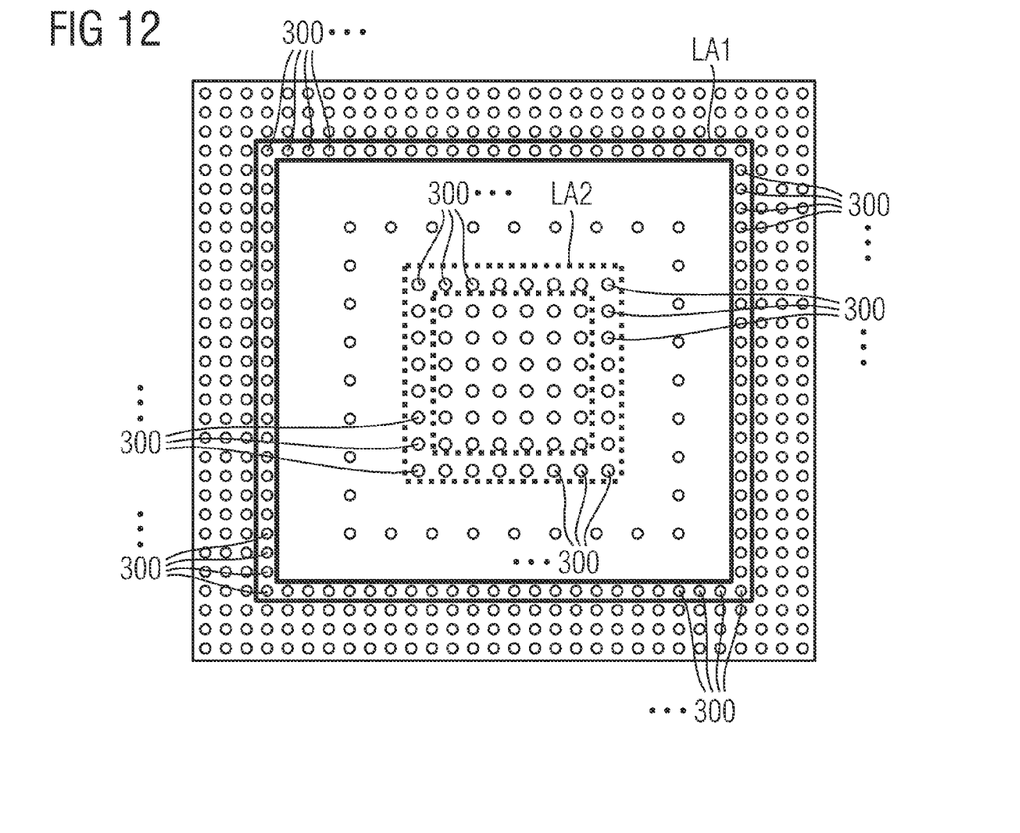
FIG. 12 illustrates an example of a layout of a terminal surface of an exemplary chip package.

FIG. 12 illustrates an exemplary terminal surface layout 1200. This layout 1200 is not restricted to but may, e.g., in particular be used for a terminal surface configured for solder ball attach and flip-chip mounting. The common terminal surface of a chip package as, e.g., described herein before may comprise a first group of terminal pads 300 of the chip package which are electrically connected to the integrated circuit chip. Again, the terminal pads 300 of the first group of terminal pads are configured as burn-in pads used during burn-in chip testing (i.e., burn-in package testing). They may also be used for debugging as described before. Here, by way of example, the first group of terminal pads 300 may form a subset of the set of all terminal pads arranged on the common terminal surface. More specifically, the terminal pads 300 of the first group of terminal pads are arranged in a predetermined regular pattern forming a sub-pattern of a pattern formed by the set of all terminal pads.

The sub-pattern may have various shapes. By way of example, the sub-pattern may comprise a regular pattern which has a shape of a straight line or a polygonal line formed by contiguous terminal pads. In FIG. 12, the contiguous terminal pads 300 contributing to the sub-pattern are shown, e.g., to be arranged in a rectangular-shaped line array. The line forming the line array may, e.g., be closed. As noted before, the terminal pads 300 may, e.g., also be used partly or completely as functional test pads.

In FIG. 12, the pattern formed by the set of all terminal pads has a varying (i.e., not constant) pitch. However, the pitch of the regular sub-pattern formed by the contiguous terminal pads 300 may, e.g., be constant.

Further, by way of example, two alternative sub-pattern formed by contiguous terminal pads 300 are illustrated in FIG. 12, namely a "smaller" line array LA2 formed in, e.g., a rectangular shape and a "larger" line array LA1 formed in, e.g., a rectangular shape. As is apparent from FIG. 12, each of these regular sub-pattern has a constant pitch (however, the pitches of the two sub-pattern may, e.g., be different).

Mapping the burn-in test functionality of terminal pads 300 into a pad array geometry as, e.g., exemplified above (e.g., in line array LA1 or line array LA2) offers the possibility to use standard low cost burn-in sockets with relaxed design constraints.

Figure 13:
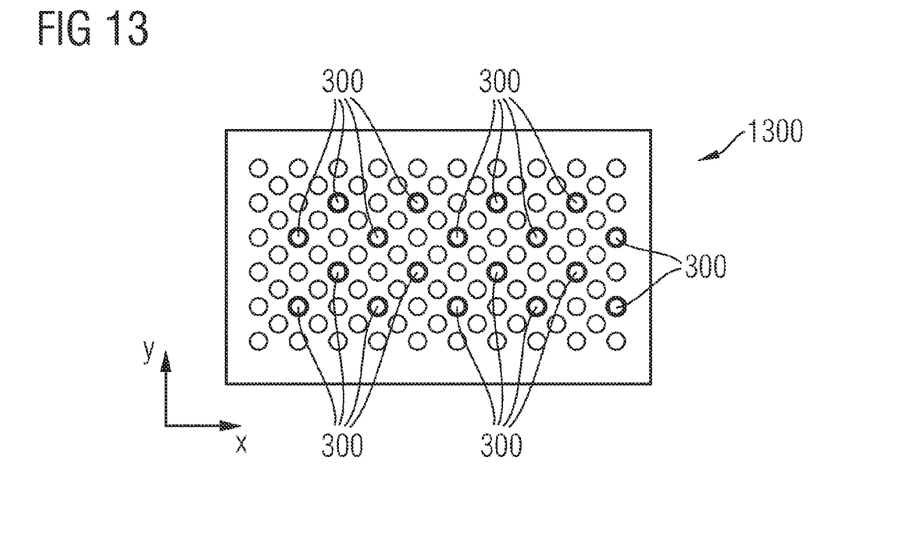
FIG. 13 illustrates an example of a layout of a terminal surface of an exemplary chip package.

FIG. 13 illustrates an exemplary terminal surface layout 1300. This layout 1300 is not restricted to but may, e.g., in particular be used for a terminal surface configured for solder ball attach and flip-chip mounting. Here, by way of example, the pattern formed by the set of all terminal pads may have a constant pitch. However, the regular pattern or sub-pattern of terminal pads 300 configured to be used in a burn-in test is, e.g., formed by non-contiguous terminal pads. More specifically, the sub-pattern of terminal pads 300 may comprise a regularly alternating or interleaved nx-ny structure (nx: number of pads between two neighboring terminal pads 300 in x-direction; ny: number of pads between two neighboring terminal pads 300 in y-direction). Only for illustrative purposes and without loss of generality, FIG. 13 exemplifies a regularly alternating or interleaved 1-1 structure. It is to be noted that the regular sub-pattern of terminal pads 300 may only extend over a partial region of the terminal surface layout 1300, e.g., over a central region thereof.

Using the concept illustrated in FIG. 13, the pitch used for burn-in testing (and, e.g., for debugging) is relaxed, thus offering the same benefits as explained above in conjunction with FIG. 12.

All implementations described herein are based on the concept of splitting the footprint layout into a first sub-section/sub-array/sub-pattern of terminal pads 300 configured for burn-in testing (and, e.g., debugging) and into a residual sub-section/sub-array/sub-pattern of terminal pads used for one or more other functionalities such as, e.g., functional testing, system integration etc. Thus, the package terminals are separated into at least two categories or classes, namely terminals 300 configured for burn-in testing, and other terminals. It is to be noted that the terminal pad function (configured for burn-in testing or not) is an implemented device function.

It is to be noted that layout designs of all Figures and specific features described in conjunction therewith may be combined if not stated otherwise herein. Further, various different bonding technologies (wire bonding, solder ball bonding, metal pillar bonding, etc.) may be used for system integration in the examples set out above, unless explicitly stated to the contrary.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A chip package comprising:
an integrated circuit chip;
a first group of terminal pads of the chip package electrically connected to the integrated circuit chip, wherein the terminal pads of the first group are aligned to contacts of a burn-in test socket;
a second group of terminal pads of the chip package electrically connected to the integrated circuit chip, wherein the terminal pads of the second group are aligned to contacts of a functional test socket; and
a third group of terminal pads of the chip package electrically connected to the integrated circuit chip, wherein no terminal pad of the third group is aligned to contacts of the burn-in test socket,
wherein the first, second and third groups of terminal pads are arranged on a common terminal surface of the chip package, wherein a pad size of a terminal pad of the first group of terminal pads is greater than a pad size of a terminal pad of the second group of terminal pads, and wherein a pad size of a terminal pad of the third group of terminal pads is smaller than the pad size of the terminal pad of the second group of terminal pads.

2. The chip package of claim 1, wherein the pad size of each terminal pad of the first group of terminal pads is greater than or equal to 250 μm.

3. The chip package of claim 1, wherein the pad size of each terminal pad of the second group of terminal pads is same or smaller than 200 μm.

4. The chip package of claim 1, wherein a pitch size of the first group of terminal pads is equal or greater than 400 μm.

5. The chip package of claim 1, wherein a pitch size of the second group of terminal pads is equal or smaller than 300 μm.

6. The chip package of claim 1, wherein the terminal pads of the first group of terminal pads are arranged in a first array an outline thereof defining a first terminal region on the common terminal surface of the chip package, and wherein the terminal pads of the second group of terminal pads are arranged in a second array an outline thereof defining a second terminal region on the common terminal surface of the chip package.

7. The chip package of claim 1, wherein the pad size of each terminal pad of the third group of terminal pads is equal or smaller than 100 μm.

8. The chip package of claim 1, wherein a pitch size of the third group of terminal pads is smaller than 150 μm.

9. The chip package of claim 6, wherein the terminal pads of the third group of terminal pads are arranged in a third array, an outline of the third array defining a third terminal region on the common terminal surface of the package, the first terminal region and third terminal region being separated from each other.

10. The chip package of claim 9, wherein the third terminal region partly or completely surrounds the first terminal region.

11. The chip package of claim 1, wherein the terminal pads of the third group of terminal pads are configured as wire bond pads.

12. The chip package of claim 1, wherein the chip package is a single-chip package.

13. The chip package of claim 1, wherein the chip package is a multi-chip package.

14. The chip package of claim 1, wherein the chip package is a wafer-level package.

15. The chip package of claim 1, wherein the integrated circuit chip has a first surface containing an active region and a second surface opposite to the first surface, the second surface being partly or completely exposed.

16. The chip package of claim 1, wherein the chip package is a bare die package.

17. The chip package of claim 1, wherein the chip package is a package with an area of the common terminal surface of the package being less than 1.5 times an area of the chip.

18. The chip package of claim 1, wherein no terminal pad of the second group of terminal pads is configured as a burn-in terminal pad.

19. The chip package of claim 1, wherein a pitch size of the first group of terminal pads is greater than a pitch size of the second group of terminal pads, and wherein the pitch size of the first group of terminal pads is equal to a pitch size of the burn-in test socket.

20. A chip package comprising:
an integrated circuit chip;
a first group of terminal pads of the chip package electrically connected to the integrated circuit chip, wherein the terminal pads of the first group are aligned to contacts of a burn-in test socket; and
another group of terminal pads of the chip package electrically connected to the integrated circuit chip, wherein the terminal pads of the other group are aligned to contacts of a functional test socket,
wherein the first group of terminal pads is arranged in a central region of a common terminal surface and having a first pitch, wherein the other group of terminal pads has a second pitch and is arranged in an region of the common terminal surface partly or completely surrounding the central region, and wherein the first pitch of the first group of terminal pads is greater than the second pitch of the other group of terminal pads.

21. The chip package of claim 20, wherein a pad size of each terminal pad of the first group of terminal pads is greater than a pad size of each terminal pad of the other group of terminal pads.

22. The chip package of claim 20, wherein the terminal pads of the first group of terminal pads and wherein the test pads of the other group of terminal pads are aligned to contacts of a burn-in test socket.

23. The chip package of claim 20, wherein the other group of terminal pads completely surrounds the central region.

24. A chip package comprising:
an integrated circuit chip;
a set of terminal pads electrically connected to the integrated circuit chip and arranged on a common terminal surface of the chip package, wherein a pattern formed by the set of terminal pads has a first pitch; and
a first group of terminal pads forming a subset of the set of terminal pads, wherein the terminal pads of the first group are aligned to contacts of a burn-in test socket,
wherein the terminal pads of the first group of terminal pads are arranged in a pre-determined regular pattern forming a sub-pattern of the pattern formed by the set of terminal pads, and wherein the sub-pattern has a second pitch which is an even multiple of the first pitch, the second pitch corresponding to a pitch of the burn-in test socket.

25. The chip package of claim 24, wherein the regular pattern has a shape of a straight or polygonal line formed by contiguously spaced terminal pads.

26. The chip package of claim 24, wherein the pattern formed by the set of terminal pads has a varying pitch, and wherein the pitch of the regular pattern is constant.

27. The chip package of claim 24, wherein the regular pattern is formed by non-contiguous terminal pads.

28. The chip package of claim 27, wherein the pattern formed by the set of terminal pads has a constant pitch.

29. A chip package comprising:
an integrated circuit chip;
a first group of terminal pads of the chip package electrically connected to the integrated circuit chip, wherein only the terminal pads of the first group are aligned to contacts of a burn-in test socket; and
a second group of terminal pads of the chip package electrically connected to the integrated circuit chip, and wherein the first and second groups of terminal pads are arranged on a common terminal surface of the chip package, wherein a pattern formed by the set of the terminal pads of the first and the second groups together has a constant pitch, and wherein the first group of terminal pads is formed by non-contiguous pads.

* * * * *